United States Patent
Abelen et al.

(10) Patent No.: US 10,193,341 B2
(45) Date of Patent: Jan. 29, 2019

(54) METHOD OF OPERATING PARALLEL TRANSFORMERS

(71) Applicant: Maschinenfabrik Reinhausen GmbH, Regensburg (DE)

(72) Inventors: Stefan Abelen, Regensburg (DE); Daniel Preissler, Obertraubling (DE); Audrius Ilgevicius, Regensburg (DE); Karsten Viereck, Regensburg (DE); Tobias Wagner, Regensburg (DE); Tobias Gruber, Regenstauf (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 15/524,951

(22) PCT Filed: Nov. 25, 2015

(86) PCT No.: PCT/EP2015/077673
§ 371 (c)(1),
(2) Date: May 5, 2017

(87) PCT Pub. No.: WO2016/096355
PCT Pub. Date: Jun. 23, 2016

(65) Prior Publication Data
US 2017/0366007 A1    Dec. 21, 2017

(30) Foreign Application Priority Data
Dec. 19, 2014    (DE) .................. 10 2014 119 158

(51) Int. Cl.
*H02J 3/18*   (2006.01)
*H02J 3/46*   (2006.01)
*G01R 19/06*  (2006.01)

(52) U.S. Cl.
CPC ............ *H02J 3/1878* (2013.01); *G01R 19/06* (2013.01); *H02J 3/46* (2013.01); *Y02E 40/30* (2013.01)

(58) Field of Classification Search
CPC ...... G05F 1/14; G05F 1/16; G05F 1/20; H02J 3/1878; H02J 3/46
See application file for complete search history.

(56) References Cited

U.S. PATENT DOCUMENTS 2,602,150 A * 7/1952 Hauck ....................... G05F 1/14
                                                      315/255
3,163,800 A * 12/1964 Pensis ...................... H02H 7/04
                                                      307/57
(Continued)

FOREIGN PATENT DOCUMENTS

DE      4004671 B    9/1991
DE      10039918 A   3/2002
(Continued)

*Primary Examiner* — Yusef A Ahmed
(74) *Attorney, Agent, or Firm* — Andrew Wilford

(57) ABSTRACT

Transformers are in a parallel circuit in which a tap changer with a control sensor is associated with each of the transformers and all control sensors are connected together by a communications connection. Each control sensor generates a measurement that is transferred by the communications connection. A measurement is generated with each of the control sensors, and at least one of the measurements of the control sensors of the transformers by the communications connection is transferred to N−1 control sensors. Then a controlling deviation caused by a circuit reactive current is calculated for each control sensor on the basis of the measurements of the control sensors. Finally the tap changer associated with each transformer is actuated by the respective control sensor as a function of the calculated controlling deviation such that minimization of the circuit reactive current is carried out for the respective transformer.

8 Claims, 4 Drawing Sheets

(56) References Cited

U.S. PATENT DOCUMENTS

| | | | | |
|---|---|---|---|---|
| 3,436,642 | A | * | 4/1969 | Segsworth ............ H02M 5/271 |
| | | | | 219/669 |
| 3,534,246 | A | * | 10/1970 | Manfred ................ H01F 29/04 |
| | | | | 323/343 |
| 5,210,443 | A | * | 5/1993 | Kugler ..................... G05F 1/24 |
| | | | | 307/17 |
| 6,031,335 | A | * | 2/2000 | Lawrence ............ C07D 501/00 |
| | | | | 307/132 R |
| 6,737,837 | B1 | * | 5/2004 | Halvarsson ............... G05F 1/70 |
| | | | | 323/205 |
| 7,930,117 | B2 | | 4/2011 | Guzman-Casillas |
| 8,321,162 | B2 | * | 11/2012 | Labuschagne ........ H02J 3/1878 |
| | | | | 702/60 |
| 2009/0218993 | A1 | * | 9/2009 | Berggren .............. H02J 3/1828 |
| | | | | 323/205 |
| 2010/0264666 | A1 | * | 10/2010 | Bo ........................ H02J 3/1878 |
| | | | | 290/55 |
| 2012/0205986 | A1 | * | 8/2012 | Frampton ............... H02J 3/381 |
| | | | | 307/84 |
| 2015/0022303 | A1 | * | 1/2015 | Von Bloh ................ H02M 5/12 |
| | | | | 336/145 |
| 2017/0358983 | A1 | * | 12/2017 | Choi ...................... G01R 25/00 |

FOREIGN PATENT DOCUMENTS

| | | |
|---|---|---|
| DE | 102008053193 A | 4/2010 |
| EP | 2389723 B | 6/2013 |
| GB | 2417376 A | 2/2006 |
| WO | 1993017480 A | 9/1993 |

\* cited by examiner

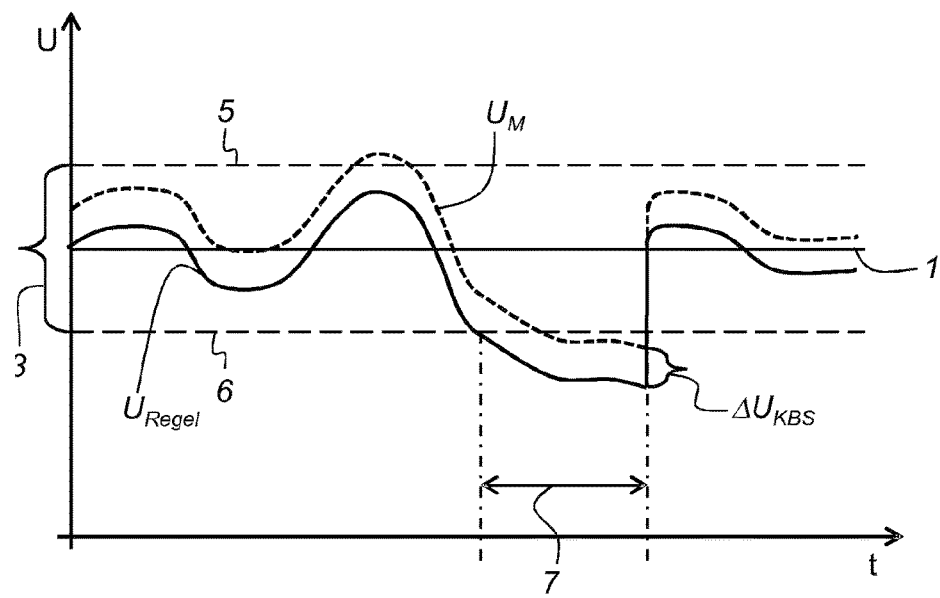
Fig. 1
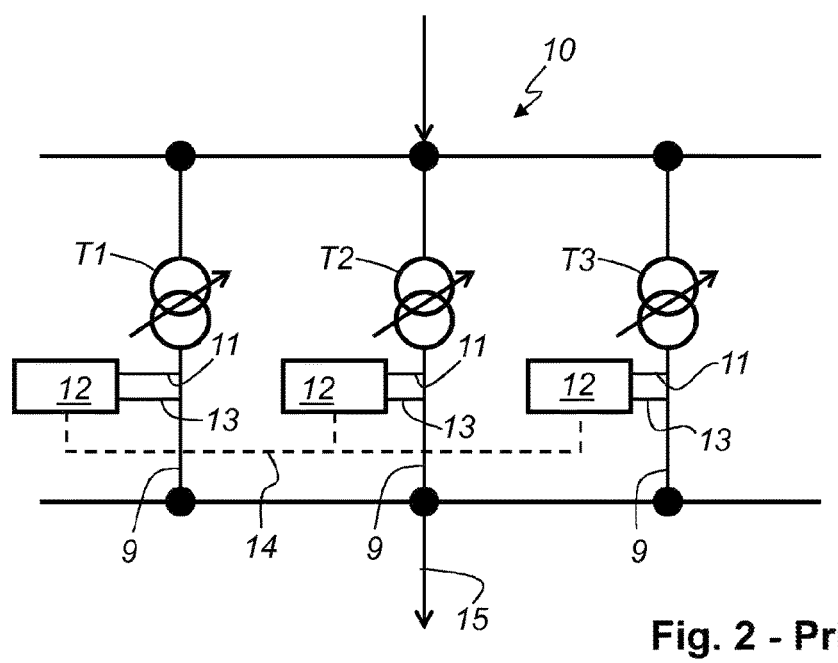
Fig. 2 - Prior Art

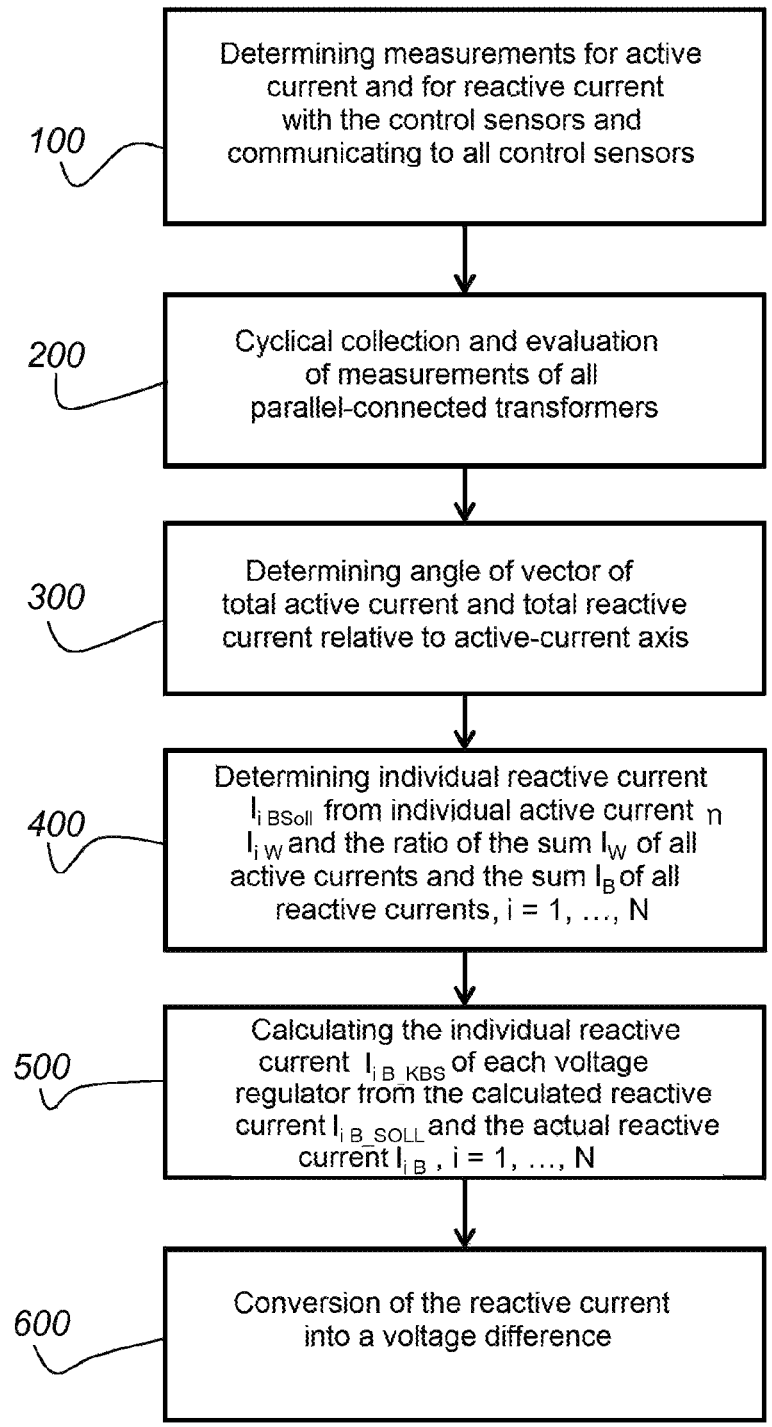
Fig. 3 - Prior art

METHOD OF OPERATING PARALLEL TRANSFORMERS

CROSS REFERENCE TO RELATED APPLICATIONS

This application is the US-national stage of PCT application PCT/EP2015/077673 filed 25 Nov. 2015 and claiming the priority of German patent application 102014119158.7 itself filed 19 Dec. 2014.

FIELD OF THE INVENTION

The present invention relates to a selective method for parallel operation of control sensors. The method serves for regulation of parallel operation of transformers. For that purpose, several transformers are arranged in a parallel circuit. A control sensor and a tap changer are associated with each of the transformers. All control sensors of the tap changer are connected together by a communications connection.

BACKGROUND OF THE INVENTION

Essentially, two methods have gained acceptance for parallel control of tap transformers.

The first method, i.e. so-called synchronous control, can be carried out only on transformers of the same voltage, power, short-circuit voltage, tap voltage and tap number. In this method all transformers of the parallel group have to be in the same operational setting. This method, also known as 'master-follower method', is otherwise the sole method for parallel control of single-phase transformers in a three-phase alternating current group.

The second method, which is disclosed in European Patent Application EP 2 389 723 A2, operates according to the so-called circuit reactive current method. This form of control of parallel operation is principally used in parallel operation of transformers with different tap numbers and different tap voltages. The method for parallel control makes auxiliary apparatus—apart from voltage regulators—no longer necessary, so that it is possible to dispense with current-conducting cross-connections between measurement transducers of transformers running in parallel. In addition, it is ensured that there is no influence from transformers, which are taken out of parallel operation, on the parallel operation of the remaining transformers and no changes are required in the settings of the control sensors. All measurements detected by the current or voltage transducers are now derived mathematically. It is thereby possible to provide all electrical parameters necessary for control of parallel operating transformers with very simple transducer circuits. The wiring between the measuring transducers and the respective control sensors is thus reduced to a minimum so that even in the case of parallel control of transformers in each instance only one current transducer and one voltage transducer are needed for each transformer. The control sensors of the individual transformers are all connected together by a CAN bus. The measurements are thus interchanged between the individual control sensors. If interruption of the CAN bus occurs, the parallel circuit shifts into emergency operation or in the worst case the parallel circuit takes from the mains.

International Patent Application WO 93/17480 A1 discloses an arrangement for voltage regulation in parallel operation of transformers. Each transformer comprises a tap changer. This is connected with a microprocessor-controlled digital regulator (control sensor). The me regulates the tap voltage. In addition, each digital regulator has an interface by which the digital regulators are connected to form a ring and the digital regulators exchange the measurement and controlling values with one another by this ring. They regulate the compensating current, which flows between the transformers, to a minimum by these values. The tap changers of the individual transformers are automatically led into an operational setting in which the circuit reactive current between the transformers reaches a minimum.

European Patent Application EP 0 482 361 [U.S. Pat. No. 5,210,443] discloses a method for parallel operation regulation of tapped transformers acting in any switch combinations on a double-busbar system. In that case, associated with each tapped transformer is a separate regulator which acts on the associated motor drive. The me in turn actuates the associated tap changer. In the method, initially the instantaneous transformer configuration is detected in a parallel control device. Subsequently, the instantaneous amplitude and phase values of voltage and current of all tapped transformers are communicated to this device, whereupon the part load current and the circuit reactive current are detected for each tapped transformer and a disturbance variable for the respective control sensor is formed therefrom.

German Patent Specification DE 40 04 671 C1 discloses a method for automatic computer-assisted recognition of plant configuration in the case of a plurality of tapped transformers which are connected in parallel as desired to different busbars and which can have different tap numbers and tapped voltages, as well as the regulation thereof. In that case, regulators associated with each tapped transformer respectively cyclically detect the active and reactive components of current and voltage. The association between transformer and corresponding busbar is undertaken in a master regulator. Subsequently, for all busbars the circuit reactive currents of the transformers connected therewith are determined in succession. Finally, the corrected voltage values are fed back to the regulators as new target values.

German Patent Application DE 100 39 918 A1 discloses self-adapting power-factor regulation (PF regulation) for minimization of circuit currents arising in mains due to parallel connected three-phase alternating current transformers. The electromotive force (EMF) of the transformers is varied in dependence on a determined value which is obtained by comparison of the $\cos_f$ at the feed point of each transformer ($\cos_{f\,actual}$) with a target $\cos_f$ of the mains ($\cos_{f\,target}$) wherein the $\cos_{f\,target}$ once correctly input at the time of setting the circuit current minimization is automatically adapted to the subsequent changes over time of the mains relationships.

OBJECT OF THE INVENTION

The invention has the object of creating a method for regulation of parallel operation of transformers in the case of failure of the communication between the control sensors and the tap changers associated with the transformers so that in the case of resumed operation of the parallel-connected transformers the risk of creation of excessively high circuit reactive currents leading to power loss is prevented.

SUMMARY OF THE INVENTION

This object is fulfilled by a method wherein at least one measurement of the respective control sensor is transmitted by the communications connection with N−1 control sensors. Calculation of a controlling deviation caused by a circuit reactive current is carried out for each control sensor on the basis of the measurements of the control sensors. The tap changer associated with each transformer is actuated in such a way on the basis of the calculated controlling deviation that minimization of the circuit reactive current for the respective transformer is undertaken. If the communications connection is interrupted, absence of a signal of at least one of the control sensors is indicated and ascertained by all remaining control sensors. The controlling deviation, which required for minimization of a circuit reactive current, of at least one transformer affected by the interruption of the communications connection is determined. This takes place on the basis of the measurements which were received by the communications connection prior to a point in time and which were transmitted by the associated control sensor of at least one further transformer. In that regard, this at least one control sensor is not affected by the interruption. In the case of the control sensor affected by the interruption, the individual instantaneously measured measurements are included in the determination of the controlling deviation.

An advantage of the method according to the invention is that the controlling process for the individual transformers of the parallel circuit continues to run and the tap changers associated with the individual transformers are supplied with appropriate control signals in order to minimize the circuit reactive current for the individual transformers or, if possible, to bring it to zero.

In one embodiment, the measurements, which were measured at each control sensor of the parallel circuit, of the respective transformers, are an active current which changes with time and a reactive current which changes with time.

The measurements of those control sensors which are isolated by the interruption of the communications connection carry out, for the duration of the interruption, calculation of the required controlling deviation for minimization of the circuit reactive current by the individual instantaneously measured measurements and by the measurements, which are regarded as a constant at the instant of the interruption and which were last transferred prior to the interruption, of the remaining control sensors. A dynamic of the parallel operation regulation of the parallel circuit of all transformers of the parallel circuit is thus maintained. The control sensor, which is affected by the interruption, of the 'isolated transformer' thus takes over the last values measured by the respective control sensors of the respective transformers, i.e. the values transferred to the 'isolated transformer'.

One possibility of carrying out the method is that in the event of complete interruption of the communication of a control sensor with the other control sensors this control sensor continues the method of circuit reactive current minimization in accordance with the invention by the last measurements of the other control sensors. As long as one control sensor still has communication with at least one further control sensor these will carry out the method of circuit reactive current minimization just with the control sensors still in communication. Other control sensors possibly affected by a communications failure are not taken into consideration by the control sensors still in communication.

According to one embodiment of the method the calculation of the controlling deviation for minimization of the circuit reactive current is carried out for those control sensors, which are still connected together by the communications connection, with the individual instantaneously measured measurements and the instantaneously measured measurements of the remaining control sensors still connected by the communications connection.

According to a further possible embodiment of the method the calculation of the controlling deviation for minimization of the circuit reactive current in the case of those control sensors which are still connected together by the communications connection can be carried out with the individual instantaneously measured measurements and the instantaneously measured measurements of the remaining control sensors still connected by the communications connection. In addition, the control sensors still connected together by the communications connection use the measurements, which are regarded as a constant, of the control sensors treated as isolated by the interruption of the communications connection at the instant or at a succession of instants.

This has the advantage that a larger number of measurements is used for calculation of the controlling deviation for the minimization of the circuit reactive current. Thus, the control sensors use the instantaneously measured measurements and measurements to be considered as constant from a point in time of the parallel regulation. The measurements to be regarded as constant originate from the at least control sensor which has no communications connection with the other control sensors of the parallel circuit of the transformers. The measurements transmitted to the other control sensors prior to the instant of the interruption are used for the further controlling process. If further control sensors should lose the communications connection with the control sensors still connected by the communications connection then use if made, for the controlling process, of those measurements which were transmitted prior to the instant of the interruption by the control sensors now considered as isolated.

In a further embodiment the number of transformers provided in a parallel circuit is greater than or equal to two and less than or equal to sixteen.

According to one embodiment of the method the signal, which is transmitted by the communications connection, of the control sensors consists of a readiness signal of the respective control sensor and the measurements of the respective control sensors. In that case, the absence of the readiness signal and/or the absence of the measurements from the respective control sensor indicates or indicate the interruption. This means that the control sensor affected by the interruption is isolated and the measurements transmitted by this control sensor prior to the instant of the interruption are assumed as a constant for the controlling process.

The readiness signal transmitted by the control sensors can be transmitted at a frequency which is higher than or the same as the transmission frequency of the measurements from the control sensors.

The advantage of the present invention is that the control sensor at a transformer [n] of the parallel circuit is not blocked. Only the [n−1] component of the sum of the part currents (the reactive current component and the active current component) is considered to be a constant. However, this applies only to that control sensor directly associated with the transformer [n]. This control sensor does not have communication and includes only the individual measurable component of the reactive current $I_{B1}$ and active current $I_{W1}$ in the calculation of a phase angle of the load, wherein i=1, ... N.

Thus:

$$I_{W1}+I_{W2}+I_{W3}+ \ldots +I_{N-1}+I_N=\Sigma I_N,$$

where $I_{W1}++I_{w2}+I_{w3}+ \ldots +I_{N-1}=\text{Const.}$ and $$I_{B1}+I_{B2}+I_{B3}+ \ldots +I_{N-1}+I_N=\Sigma I_B,$$

where $I_{B1}+I_{B2}+I_{B3}+ \ldots +I_{N-1}$=Const.

As a consequence thereof the risk of creation of circuit reactive currents is significantly reduced, also because all other control sensors can operate in accordance with the same calculation rule and at least a partial dynamic of the controlling circuit is maintained.

An additional monitoring of the voltage band is a further means for ensuring the operational state of the parallel operating transformers in the event of failure of the communication.

The control sensor is preferably constructed as a voltage regulator of a tap changer.

BRIEF DESCRIPTION OF THE DRAWING

The invention and the advantages thereof are described in more detail in the following with reference to the accompanying drawings in which:

FIG. 1 is a time plot of the voltage measured at a transformer of a parallel circuit and the controlling voltage;

FIG. 2 is a schematic illustration of a parallel circuit of three transformers known from the prior art;

FIG. 3 is a schematic plot of the method, which is known from the prior art, for parallel control of several transformers with tap changers;

Identical reference numerals are used in the figures for the same or equivalent elements of the invention. In addition, for the sake of clarity only reference numerals required for description of the respective figure are illustrated in the individual figures.

FIG. 1 is a time plot of the measured voltage $U_M$ of a transformer of a parallel circuit of transformers, which as seen over time lies in a range 3 defined by an upper voltage level 5 and a lower voltage level 6. Lying between the upper voltage level 5 and the lower voltage level 6 is a target value 1 of the voltage about which the voltage $U_{Regel}$ to be regulated can fluctuate without the tap changer switching the secondary side of the transformer to be one or more steps higher or switching the secondary side of the transformer to be one or more steps lower. The tap changer switches only when the voltage $U_{Regel}$ to be regulated exceeds the upper voltage level 5 or falls below the lower voltage level 6 for a pre-defined time period 7. The voltage $U_{Regel}$ to be regulated is brought back to the range 3 by actuation of the tap changer, as shown in FIG. 1. As similarly shown in FIG. 1, the controlling voltage $U_{Regel}$ is composed of the measured voltage UM, a voltage component $\Delta U_{KBS}$ due to the circuit reactive current and a voltage compensation component $\Delta U_{KOMP}$. For the controlling voltage $U_{Regel}$ there applies:

$$U_{Regel}=U_M+\Delta U_{KBS}+\Delta U_{KOMP} \quad \text{Equation (1)}$$

Figure 4:
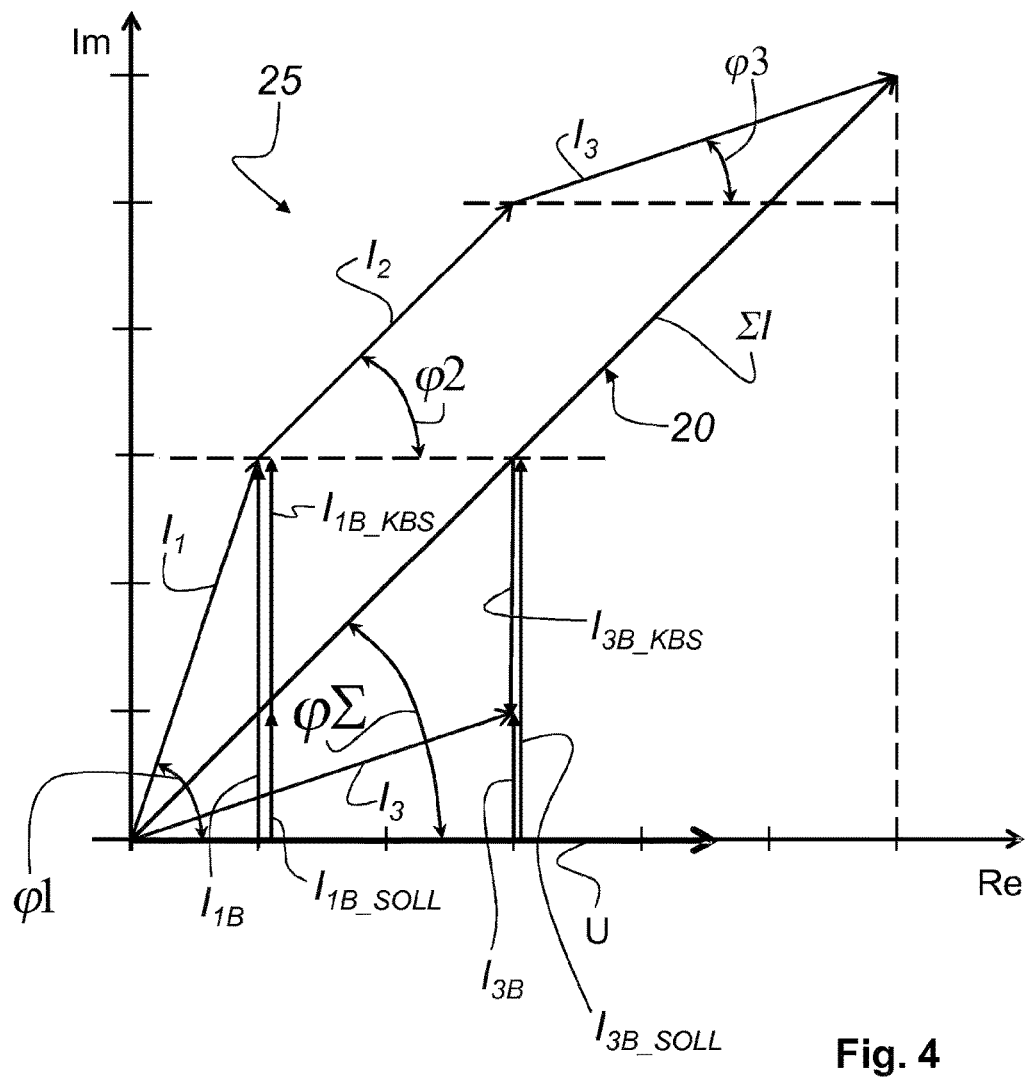
FIG. 4 is a schematic illustration for determination of the angle φΣ of the vector of total effective current and total reactive current in the electrical vector diagram.

FIG. 2 is a schematic illustration of a parallel circuit 10 of three transformers T1, T2 and T3. Although the following description for the method according to the invention relates to three transformers, this is not to be taken as restrictive. It will be obvious to an expert that the invention can also be used for any multiple of transformers T1, T2, ..., TN of substantially the same type. According to a preferred embodiment at least two and at most sixteen transformers are connected in parallel. A respective control sensor 12 is associated with each output 9 of each transformer T1, T2 and T3. The control sensor 12 performs a current measurement 11 and a voltage measurement 13 at the output 9 of each transformer T1, T2 and T3. In addition, the control sensors 12 of the individual transformers T1, T2 and T3 are connected together by a common communications connection 14. The communications connection 14 can be, for example, a CAN bus.

The measurement of current and voltage by the respective control sensors 12 is not carried out on the basis of the actually present voltage, for example 230 kV and the flowing current of approximately 100 A. For measurement of the voltage there is thus used a 'voltage transformer' (not illustrated) which lowers the voltage from, for example, 230 kV to, for example, 100 V. For measurement of the current use is made of a 'current transformer' (not illustrated) which lowers the current from, for example, 100 A to, for example, 1 A. The voltage transducer secondary nominal voltage $U_{VT\_SEC}$ and the current transducer secondary nominal current $I_{CT\_SEC}$ are included in the further calculation.

Initially, the method illustrated in FIG. 3 shall be explained in its entirety. Parallel control is carried out by the parallel circuit, which is illustrated on the basis of FIG. 2, of three transformers T1, T2 and T3 so as to keep the reactive current as small as possible, approximately at zero. The reactive current is zero when the angles of the currents of all transformers are equal to the angle of the total current. The method consists of several individual method steps.

Initially, in a first method step 100 individual measurements for the active current I1W, I2W and I3W and for the reactive current $I_{1B}$, $I_{2B}$ and $I_{3B}$ are determined by each control sensor 12 and communicated to the other control sensors 12 of the other transformers T1, T2 and T3.

In a second method step 200, the measurements of all transformers T1, T2 and T3 connected in parallel are cyclically collected and evaluated. It is critical for this step of the method that an individual control sensor 12 is associated with each transformer T1, T2 and T3 connected in parallel and that all control sensors 12 are connected together by the common communications connection 14, for example a CAN bus, for information exchange. This so-called CAN (Controller Area Network) bus offers, apart from high transmission speed with simplest installation, a high measure of transmission security. All control sensors 12 can accordingly exchange data with the other control sensors 12 of the parallel connected transformers T1, T2 and T3.

Subsequently, in a third method step 300, from the collected measurements the vector 20 of total active current and total reactive current of all transformers is recorded in the electrical vector diagram (see FIG. 4). The vector 20 includes an angle φΣ with the X axis of the electrical vector diagram.

Each control sensor 12 determines the sum $\Sigma I_W$ of all active currents and the sum $\Sigma I_B$ of the reactive currents of all parallel connected transformers T1, T2 and T3.

$$I_{1W}+I_{2W}+I_{3W}+ \ldots +I_{NW}=\Sigma I_W \quad \text{Equation (2)}$$

and $$I_{1B}+I_{2B}+I_{3B}+ \ldots +I_{NB}=\Sigma I_B \quad \text{Equation (3)}$$

Subsequently, in a fourth step 400 the individual target reactive current $I_{1BSOLL}$ is determined from the individual active current $I1_W$ and the ratio of the sum $\Sigma_{IW}$ of all active currents to the sum $\Sigma_{IB}$ of all reactive currents by each control sensor 12.

$$I_{1BSOLL}/I_W = \Sigma I_B/\Sigma I_W \qquad \text{Equation (4)}$$

$$I_{1BSOLL} = I_W * \Sigma I_B/\Sigma I_W \qquad \text{Equation (5)}$$

On the assumption that, when a tap changer is switched, at one of these parallel connected transformers T1, T2, . . . , T3, for example, only the reactive current I1B through the corresponding transformer T1 changes (the connected load in fact remains constant) and the control sensor 12 knows the active current I1W of the corresponding transformer T1, it is now possible to calculate the level of the reactive current I1BSOLL which would be necessary in order together with the measured active current I1W to make it parallel with the vector 20 of total active current and total reactive current.

Calculation of the individual circuit reactive current I1B_KBS of each control sensor 12 from the calculated target reactive current I1B_SOLL and the individual reactive current I1B is carried out in the fifth method step 500. It may be mentioned again at this point that the calculation here and also in the following is, in fact, specifically described merely for i=1, thus for the transformer T1, but the calculation is carried out analogously for all transformers T1, T2, . . . , TN, i=1, N of the parallel circuit.

As a result of the preceding method step 500, the control sensor 12 knows the target reactive current I1B_SOLL, which conveys the load, and the contribution of the reactive current I1B. The me the associated transformer T1 delivers for that purpose.

The circuit reactive current can now be calculated from the difference of the target reactive current I1B_SOLL and the reactive current I1B of the respective transformer with consideration of the signs of the two currents:

$$I_{1B\_KBS} = I_{1B} - I_{1B\_SOLL} \qquad \text{Equation (6.1)}$$

$$I_{2B\_KBS} = I_{2B} - I_{2B\_SOLL} \qquad \text{Equation (6.2)}$$

$$I_{3B\_KBS} = I_{3B} - I_{3B\_SOLL} \qquad \text{Equation (6.3)}$$

The above equations make clear the calculation of the respective circuit reactive current $I_{1B\_KBS}$, $I_{2B\_KBS}$ and $I_{3B\_KBS}$ for the three parallel connected transformers T1, T2 and T3 (see FIG. 2).

This difference of the target reactive current I1B_SOLL and the reactive current $I_{1B}$ of the transformer T1 is the circuit reactive current $I_{1B\_KBS}$ and shall be minimized by actuation of the tap changer at the respectively associated transformer T1, T2, . . . , TN, here actually T1. $I_{1B\_KBS}$ is the controlling deviation for the transformer T1.

The voltage difference $\Delta U_{KBS}$ is derived in a sixth step 600 from $I_{1B\_KBS}$ by recalculation.

If the controlling deviation is not equal to zero and exceeds the level of the controlling deviation of a predetermined limit value then the control sensor 12 will have the effect on the tap changer that this moves to a position or tap of the respective transformer at which the reactive current I1B through the transformer T1 is minimal, at the best zero. Through actuation of the tap changer essentially the inductive component of the current flowing through the respective transformer T1, T2, . . . , TN is influenced. This means that an increase and a decrease of the longitudinal impedance of the respective transformer T1, T2, . . . , TN oppose the circuit reactive current $I_{1B\_KBS}$.

When the tap changer is actuated, windings of the controlling winding are connected with or disconnected from the main winding.

Since this controlling deviation is calculated on a sign basis by each of the parallel connected control sensors 12 for the respective transformer T1, T2, T3, all control sensors 12 cause their tap changers, which are associated with the transformers T1, T2, T3, to move to a tap-changer position at which the respective circuit reactive current $I_{1B\_KBS}$, $I_{2B\_KBS}$ or $I_{3B\_KBS}$ is minimal, at the best zero.

In that case, one tap changer can indeed be moved to a higher tap changer setting whilst the other tap changers move to a lower position.

Reference is made to the electrical vector diagram disclosed in FIG. 4 for illustration of the angle $\varphi\Sigma$ of the vector 20 of the collected measurements of total active current and total reactive current with respect to the X axis. For that purpose, measurements for the active current for the three transformers T1, T2 and T3 assume the following values (see Table 1) for the respective active current $I_W$ and the respective reactive current $I_B$.

TABLE 1

|  | Transformer 1 | Transformer 2 | Transformer 3 |
|---|---|---|---|
| $I_W$ [active current] | 1A | 2A | 3A |
| $I_B$ [reactive current] | 3A | 2A | 1A |

Thus, as apparent from FIG. 4, for the sum $\Sigma I_W$ of all active currents and the sum $\Sigma_{IB}$ of all reactive currents in each instance the value 6 A arises. The object of parallel regulation of the transformers T1, T2 and T3 is to change the components of the respective active currents $I_{1W}$, $I_{2W}$, $I_{3W}$ and the components of the respective reactive currents $I_{1B}$, $I_{2B}$, $I_{3B}$ in such a way that the angle thereof adopts the same value with respect to the active current axis W in the electrical vector diagram 25. In the case of the illustration shown in FIG. 4, $\varphi1 > \varphi\Sigma$, $\varphi2 = \varphi\Sigma$ and $\varphi3 < \varphi\Sigma$. Since by the tap changers of the transformers T1, T2 and T3 the taps at the transformers are connected in dependence on the measured values, adaptation or minimization of the circuit reactive current is achieved. A controlling deviation of a current $D_{IN\_KBS}$ for each control sensor 12 of a transformer T1, T2, . . . , TN can be calculated. This controlling deviation thus results from consideration of the individual currents $I_1$, $I_2$ and $I_3$, particularly the vectors thereof in the vector diagram.

As a result thereof, a minimum circuit reactive current always flows through all parallel connected transformers after the end of the controlling process.

Figure 5:
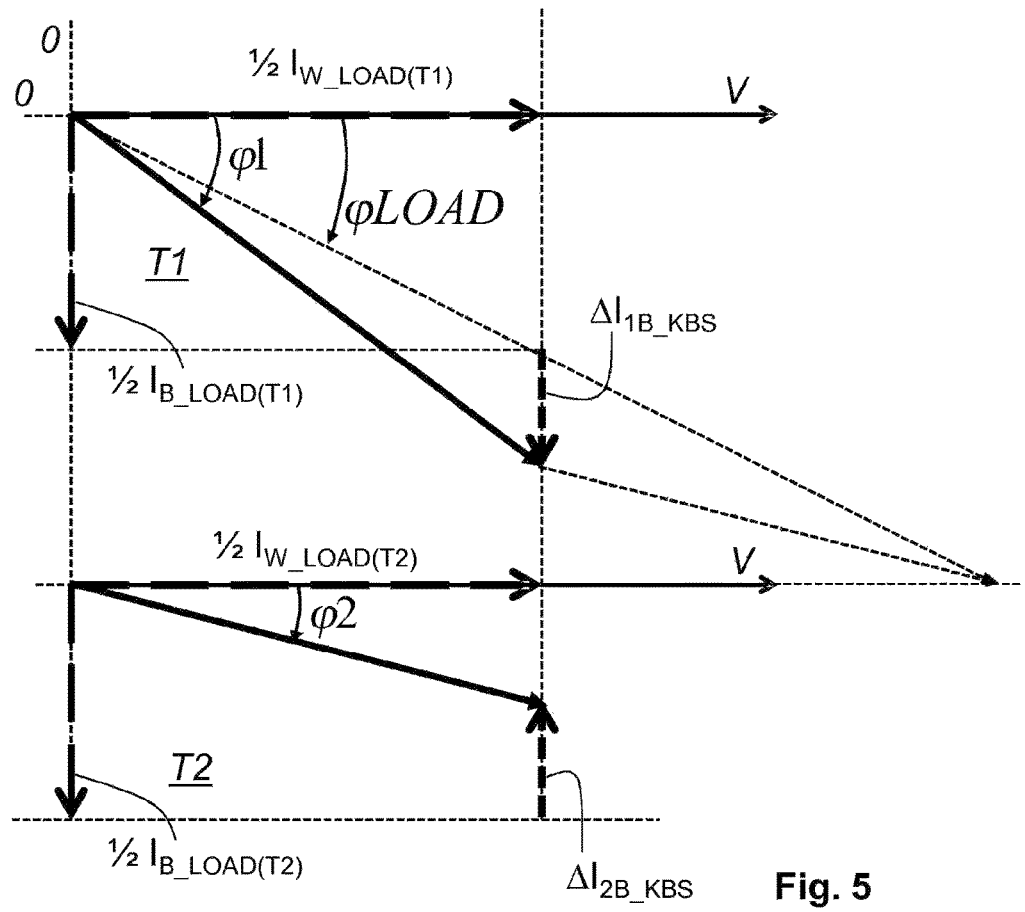
FIG. 5 is a schematic illustration of the load relationships and the respectively resulting controlling deviation in the case of parallel operation of two transformers.

FIG. 5 is a schematic illustration of the load relationships and the respectively resulting controlling deviation in the case of parallel operation of two transformers T1 and T2. The phase angle $\varphi_{LOAD}$ (corresponds with $\varphi\Sigma$ of FIG. 4) of the load 15 of the parallel circuit of the two transformers T1 and T2 is predetermined by the characteristics thereof and cannot be influenced by the control sensor 12 and the associated transformer T1 or T2.

The tap changer, which is associated with each transformer T1 and T2, as longitudinal regulator influences substantially only the inductive component (reactive current) of the total current flowing through the transformer T1 or T2. This is due to the relationship that the inductive component (reactive current) is substantially larger than the active component (active current).

The controlling deviation $\Delta I_{1B\_KBS}$ or $\Delta I_{2B\_KBS}$ for the respective control sensor 12 of the associated and parallel operating transformer T1 or T2 is calculated by consideration of the reactive currents for each individual transformer T1 or T2:

$$\Delta I_{1B\_KBS} = I_{1B} - I_{1BSOLL}$$

In that case, $I_{1BSOLL}$ is calculated from $$(I_{1B}+I_{2B})/(I_{1W}+I_{2W}))*I_{1W}$$

and the inductive component (reactive current component) of the first transformer T1.

Analogously:

$$\Delta I_{2B\_KBS} = I_{2B} - I_{2BSOLL}$$

In that case, $I_{2BSOLL}$ is calculated from $$((I_{1B}+I_{2B})/(I_{1W}+I_{2W}))*I_{2W}$$

and the inductive component (reactive current component) of the second transformer T2.

The controlling deviation will then be smallest (ideally equal to zero) if the measured phase angle φ1 or φ2 at the first transformer T1 or second transformer T2 is equal to that of the load$_{load}$ (corresponds with φΣ of FIG. 4) of the parallel circuit of the first transformer T1 or second transformer T2.

This is achieved by changing the longitudinal impedance of the respective transformer T1 or T2 by the tap changer with which each of the transformers T1 and T2 is associated. Through actuation of the tap changer, windings of a controlling winding are connected with or disconnected from a main winding.

Figure 6:
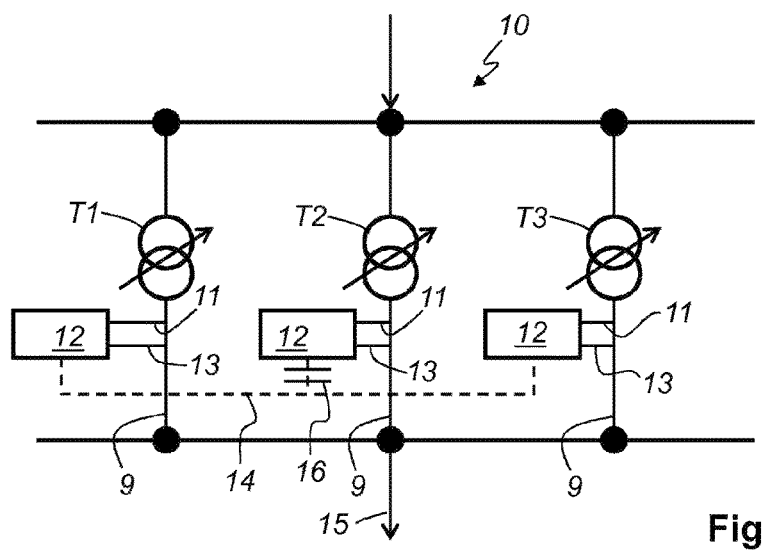
FIG. 6 is a schematic illustration of the parallel circuit of three transformers of FIG. 3, in which the method according to the invention is used and only the control sensor of the tap changer of the second transformer is affected by an interruption.

FIG. 6 is a schematic illustration of the parallel circuit 10 of three transformers of FIG. 3, in which the method according to the invention continues notwithstanding an interruption 16 of the communications connection 14. By the communications connection 14 each of the control sensors 12 of the respective transformers T1, T2 and T3 obtains, at regular time intervals, data about the measurements $I_W$ (active current) and $I_B$ (reactive current) of the remaining transformers T1, T2 and T3. In continuing operation, then—as already mentioned above—the parallel circuit 10 of the transformers T1, T2 and T3 is so controlled by the measurements of the parallel circuit 10 that the circuit reactive current of the individual transformers T1, T2 and T3 is minimal, at the best equal to zero. Each of the control sensors 12 obtains by the communications connection 14 the information of the other control sensors 12 that are still reachable by the communications connection 14. For that purpose, all control sensors 12 transmit a signal (readiness signal) at specific intervals in time. If a signal no longer comes from one or more control sensors 12, then this means that the one or more control sensors 12 is or are no longer reachable and that an interruption 16 of the communications connection 14 is present.

In the case of the illustration shown in FIG. 6, the interruption 16 of the communications connection 14 is present at, for example, the control sensor 12 of the second transformer T2. This means that no information can be transmitted from the control sensor 12 of the first transformer T1 and from the control sensor 12 of the third transformer T3 to the control sensor 12 of the second transformer T2. On the other hand, the control sensors 12 of the first transformer T1 and of the third transformer T3 do not receive any information from the control sensor 12 of the second transformer T2. This means that the two control sensors 12 of the first transformer T1 and of the third transformer T3 continue to set a minimum circuit reactive current without then taking into consideration the values of the control sensor 12 of the second transformer T2, since no measurements can be delivered by this due to the interruption 16.

The control sensor 12 of the second transformer T2 continues the method for setting a minimum circuit reactive current with use of the last communicated values of the control sensors 12 of the first transformer T1 and the third transformer T3.

The advantage of the present invention is that the measurements of the control sensor 12 which has failed due to the interruption 16 are assumed as a constant by the other control sensors 12. Thus, the transformer at which the interruption 16 of the control sensor 12 occurred continues to be taken into consideration in the parallel operation. That control sensor 12 which no longer has communication with other control sensors 12 assumes the last values of the other control sensors 12 as a constant and continues the method of circuit reactive current minimization. Control sensors 12 which still have communication with at least one other control sensor 12 continue to perform the method of circuit reactive current minimization and, in particular, only with the control sensors 12 participating in the communication.

In other words, in the present, concretely described case this means that the second (isolated) transformer T2 is controlled by the last measurements, which were transmitted by the communications connection 14, by the associated control sensor 12.

The control sensor 12 at the second transformer T2 should not be blocked by the above-proposed and improved solution (see FIG. 6). In the case illustrated here, the component of the sum of the part currents (the reactive current and also the active current component) is to be considered as a constant by the control sensor 12 of the first transformer T1 and by the control sensor 12 of the third transformer T3.

As a consequence thereof, risk of creation of circuit reactive currents is significantly reduced, additionally because all other control sensors 12 can operate in accordance with the same calculation rule and a partial dynamic of the controlling circuit is maintained notwithstanding the interruption.

As apparent from the above equations, the values. The me were determined by the control sensors 12 before the interruption, for active current IW and reactive current IB are included in the calculation of $\Delta U_{KBS}$ in the event of interruption of the communications connection 14. These values remain constant until reinstatement of the communications connection 14, so that the sum $\Sigma I_W$ of all active currents and the sum $\Sigma I_B$ of all reactive currents can be calculated for the duration of the interruption.

The invention was described with reference to one embodiment. It will be obvious to an expert that changes and modifications can be carried out without in that case departing from the scope of protection of the following claims.

The invention claimed is:

1. A method of controlling parallel operation of N transformers in a parallel circuit in which a respective tap changer of each transformer has a respective control sensor and all of the control sensors are connected together by a communications connection, N being equal to or greater than 2, the method comprising the steps of:
generating a measurement with each of the control sensors;
transferring at least one of the measurements of the control sensors of the transformers by the communications connection to the N−1 remaining control sensors;

calculating a controlling deviation caused by a circuit reactive current for each control sensor on the basis of the measurements of the control sensors;

actuating the tap changer associated with each transformer by the respective control sensor as a function of the calculated controlling deviation such that minimization of the circuit reactive current is carried out for the respective transformer;

detecting absence of at least one signal of at least one of the control sensors caused by interruption of the communications connection at an instant and reporting the absence of the at least one signal of the at least one control sensor to all remaining control sensors; and determining the controlling deviation required for minimization of the circuit reactive current of the at least one control sensor affected by the interruption of the communications connection on the basis of the measurements from at least one further control sensor of at least one further transformer of the N transformers not affected by the interruption of the communications connection and received by the communications connection prior to the instant; and including with the at least one further control sensor affected by the interruption the individual instantaneously measured measurements of its respective transformer in the determination.

2. The method defined in claim 1, wherein the measurements measured at each control sensor of the parallel circuit, of the respective transformers are each an active current changing with time and a reactive current changing with time.

3. The method defined in claim 1, further comprising the step of:

using the instantaneously measured measurements of the control sensors still connected together by the communications connection and of the remaining control sensors still connected by the communications connection for calculation of the required controlling deviation for minimization of the circuit reactive current.

4. The method defined in claim 1, further comprising the step of:

using the instantaneously measured measurements of the control sensors still connected together by the communications connection and of the remaining control sensors still connected by the communications connection and the measurements regarded as a constant of the control sensors treated as isolated by the interruption of the communications connection at the instant for calculation of the required controlling deviation for minimization of the circuit reactive current.

5. The method defined in claim 1, wherein the number of transformers provided in the parallel circuit is at least two and less than or equal to sixteen.

6. The method defined in claim 1, wherein the at least one signal transferred by the communications connection from the control sensors consists of a readiness signal of the respective control sensor and the measurements of the respective control sensors.

7. The method defined in claim 6, wherein the absence of the readiness signal and/or the absence of the measurements from the respective control sensor indicates or indicate the interruption, and the affected control sensor is isolated.

8. The method defined in claim 6, wherein the readiness signal is transmitted from the control sensors at a frequency higher than or equal to a transmission frequency of the measurements from the control sensors.

* * * * *